United States Patent [19]

Miura et al.

[11] Patent Number: 4,630,237

[45] Date of Patent: Dec. 16, 1986

[54] READ-ONLY MEMORY AND METHOD OF MANUFACTURING THE SAME

[75] Inventors: Kenji Miura, Isehara; Shigeru Nakajima, Chigasaki; Kazushige Minegishi, Atsugi; Toshifumi Somatani; Takashi Morie, both of Zama; Tatsuo Baba, Yokohama, all of Japan

[73] Assignee: Nippon Telegraph & Telephone, Tokyo, Japan

[21] Appl. No.: 759,009

[22] Filed: Jul. 24, 1985

[30] Foreign Application Priority Data

Jul. 28, 1984 [JP] Japan ................................. 59/157955

[51] Int. Cl.[4] .................... G11C 11/40; G11C 13/00
[52] U.S. Cl. .................................... 365/104; 365/51; 357/41; 357/55
[58] Field of Search ............... 365/103, 104, 182, 184, 365/185, 189, 51; 357/40, 41, 45, 55

[56] References Cited

U.S. PATENT DOCUMENTS 4,222,062 9/1980 Trotter et al. ...................... 365/185

OTHER PUBLICATIONS

"VMOS ROM" by T. J. Rodgers et al., IEEE Journal of Solid-State Circuits, vol. SC-11, No. 5, Oct. 1976.

Primary Examiner—Terrell W. Fears
Attorney, Agent, or Firm—Townsend & Townsend

[57] ABSTRACT

A read-only memory has memory cells each with a vertical metal oxide semiconductor field effect transistor and a bit line. The vertical metal oxide semiconductor field effect transistor has a gate electrode serving as a word line, a source, a drain, and a vertical channel region between the source and drain constituted by first and second diffusion layers. The gate electrode is formed on a side wall of a trench, which has a pair of side walls substantially perpendicular to a major surface of a semiconductor substrate of a first conductivity type and an interconnecting bottom surface substantially perpendicular to the side wall surfaces. The first and second diffusion layers of a second conductivity type are formed in an upper portion of the semiconductor substrate and in a bottom of the trench, respectively. The bit lines are formed in a predetermined pattern. One of the first and second diffusion layers is connected to the bit line through a contact hole and the other of the first and second diffusion layers is used as a common current line. A method of manufacturing the read-only memory is also proposed.

9 Claims, 32 Drawing Figures

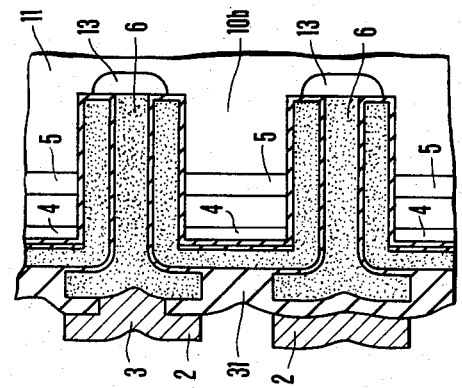
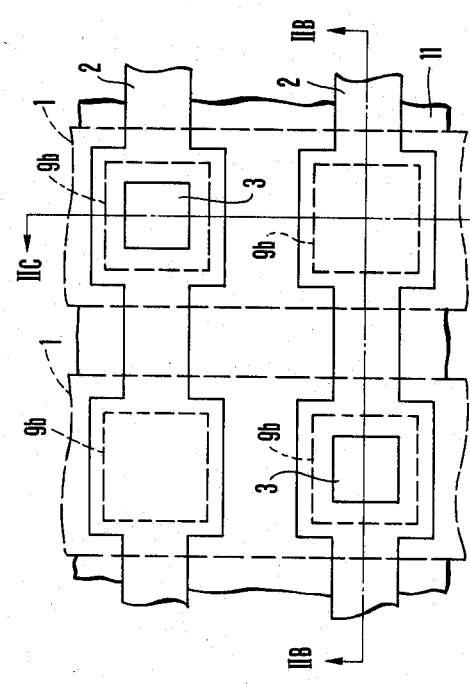
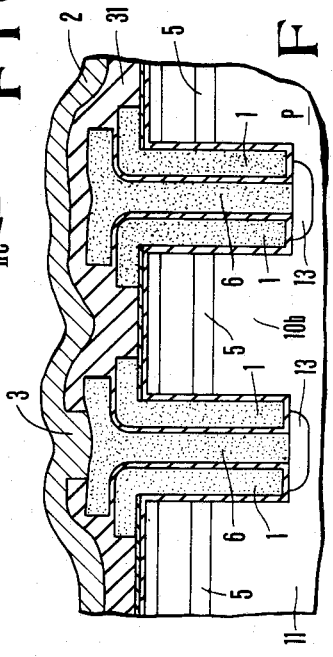
FIG.2A
FIG.2B
FIG.2C

READ-ONLY MEMORY AND METHOD OF MANUFACTURING THE SAME

BACKGROUND OF THE INVENTION

The present invention relates to a read-only memory and a method of manufacturing the same and, more particularly to a cell structure of a high-density read-only memory using a vertical MOSFET and a method of manufacturing the same.

In a conventional mask ROM using a MOSFET, a current ON/OFF state and the presence/absence of a MOSFET are used to store data of logic "1" or "0". For example, contact hole and threshold voltage write type ROMs with different margins of channel doping or different gate oxide film thicknesses are used in practice. On the other hand, in a conventional contact hole write type ROM, the data write process is performed at the end of the entire process in favor of short turn-around time of ROM development, thereby achieving low-cost mask ROMs. A conventional threshold voltage write type ROM requires 0.5 contact hole/bit, while a conventional contact write type ROM requires one contact hole/bit. The threshold voltage write type ROM requires a small number of contact holes as compared with that of the contact hole write type ROM. Therefore, the memory cell size of the threshold voltage write type ROM is smaller than that of the contact hole write type ROM. For example, the threshold voltage write type ROM is exemplified by a VMOSTr described in IEEE Vol. SC-11 No. 5, Oct. 1976, P. 614.

Although the above-mentioned two types of ROMs have respective advantages, an element isolation region must be formed between each adjacent memory cells so as to electrically isolate them from each other. In contact writing, for example, an area of a unit memory cell which includes an element isolation region is about 10 $\mu m^2$ when a pattern size is 1.0 $\mu m$ and an overlay accuracy is 0.2 $\mu m$. When a pattern size is about 0.5 $\mu m$ and an alignment precision is about 0.1 $\mu m$, the area of the unit memory cell is about 6 $\mu m^2$. Therefore, contact writing is not suitable for a large scale integration or a high packing density.

SUMMARY OF THE INVENTION

It is, therefore, a principal object of the present invention to provide a read-only memory of a new and improved structure suitable for a high packing density in a mask ROM using a MOSFET for contact writing or threshold voltage writing and a method of manufacturing the same.

According to an aspect of the present invention, there is provided a read-only memory comprising memory cells each having a vertical metal oxide semiconductor field effect transistor and a bit line, the vertical metal oxide semiconductor field effect transistor having a gate electrode serving as a word line and source/drain and a vertical channel region between the diffusion layers constituted by first and second diffusion layers, the gate electrode being formed on a side wall of a trench, which is substantially vertically formed in a major surface of a semiconductor substrate of a first conductivity type, the first and second diffusion layers being formed in an upper portion of the semiconductor substrate and in a bottom of the trench, respectively, the bit lines being formed in a predetermined pattern, one of the first and second diffusion layers being connected to the bit line through a contact hole and the other of the first and second diffusion layers being used as a common current line.

According to another aspect of the present invention, there is provided a method of forming a read-only memory, comprising the steps of: forming a first diffusion layer of a second conductivity type in a major surface of a semiconductor substrate of a first conductivity type within a predetermined region; forming a trench having a side wall surface substantially perpendicular to the major surface of the semiconductor substrate within the predetermined region; forming a gate insulating film on a wall of the trench; forming a conductive layer in a predetermined region of a gate insulating film so as not to completely fill the trench, and anisotropically etching the conductive layer and the gate insulating film from the bottom of the trench, thereby forming a word line serving as a gate electrode on the side wall surface of the trench; forming a second diffusion layer of the second conductivity type at the bottom of the trench; forming a first insulating film on the surface of the word line and forming a material as to fill the trench; forming a second insulating film to cover an entire surface; forming a contact hole; and patterning the conductive layer to form a bit line.

BRIEF DESCRIPTION OF THE DRAWINGS

FIG. 2A is a plan view of a read-only memory according to another embodiment of the present invention;

FIGS. 2B and 2C are respectively cross-sectional views of the ROM when taken along the lines A—A' and B—B' of FIG. 2A;

DESCRIPTION OF THE PREFERRED EMBODIMENTS

The present invention will be described in detail with reference to preferred embodiments of the present invention in conjunction with the accompanying drawings.

Figure 1C:
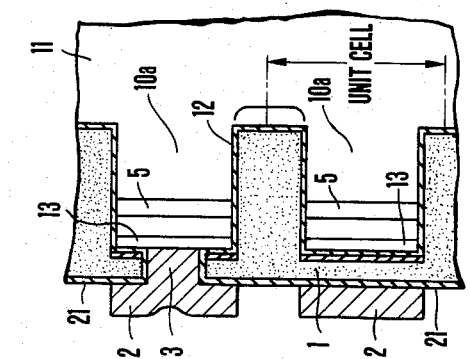
FIGS. 1B and 1C are respectively cross-sectional views of the ROM when taken along the lines A—A' and B—B' of FIG. 1A.
Figure 1A:
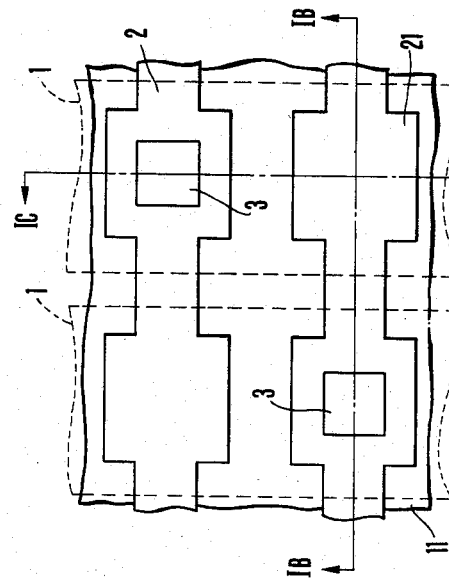
FIG. 1A is a plan view of a read-only memory according to an embodiment of the present invention.
Figure 1B:
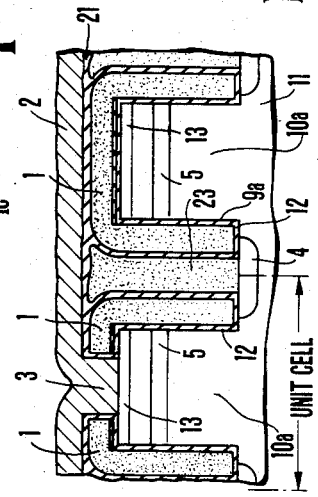

FIGS. 1A to 1C respectively show a read-only memory (ROM) according to an embodiment of the present invention. Referring to FIGS. 1A to 1C, reference numeral 1 denotes a polysilicon film serving as a word line as well as a gate electrode of a vertical MOSFET; 2, a bit line connected to an n-type diffusion layer; 13, an n-type bit line connecting diffusion layer; 3, a contact hole for connecting the bit line 2 and the diffusion layer 13; 4, an n-type common current line diffusion layer; 5, a channel doped layer including a p-type impurity for controlling a threshold voltage; 11, a p-type semiconductor substrate; 9a, a matrix- or grid-like trench which has side wall surface substantially perpendicular to a major surface of the semiconductor substrate 11 and which has a pattern narrowed in a direction parallel to the bit line and widened in a direction parallel to the word line; 10a, a channel region in a silicon region surrounded by the trench 9a; 12, a silicon oxide film; 15, a silicon nitride film; 17, a gate insulating film for forming the polysilicon film 1; 21, a silicon oxide film; and 23, a polysilicon film. Data of logic "1" or "0" is written in accordance with the presence or absence of the contact hole 3. In the ROM having the structure described above, each memory cell is surrounded by the grid-like trench, so that each two adjacent memory cells are isolated by the trench. Unlike in the conventional technique, an element isolation region need not be formed, thereby achieving a high packing density. For example, with the above structure, when a 0.5 μm rule is used, a memory cell size is about 2 μm², thereby achieving a sufficient high packing density. A vertical MOSFET as an intracell transistor is formed in a region surrounded by the trench 9a and the four side walls of the trench 9a serve as a channel. A channel width of the resultant memory circuit can be increased, and the circuit has a large load drive capability to drive the bit line at high speed and to detect a bit line signal. In addition, a longitudinal width of the trench is different from its transverse width, so that the intracell element isolation region can be formed in a self-aligned manner. As a result, a higher packing density can be achieved.

FIGS. 2A to 2C respectively show another embodiment of the present invention. Referring to FIGS. 2A to 2C, reference numeral 6 denotes a polysilicon film as a bit line electrode; 9b, an island trench (discretely located with other trenches) which has side wall surfaces substantially perpendicular to a major surface of a semiconductor substrate 11 and which has a pattern narrowed along a direction parallel to a bit line and widened along a direction parallel to a word line; 10b, a channel region around the trench 9b; and 31, a phosphosilicate glass (PSG) film as an insulating interlayer. Unlike in the embodiment of Figs. 1A to 1C, the common current line diffusion layer is replaced with a bit line connecting diffusion layer. Diffusion layers 4 each serving as a common current path are formed on the convex-shaped channel regions 10b in a matrix form to effectively decrease a resistance of the diffusion layers 4. The memory cell area of this embodiment is about 2 μm² in the same manner as in the first embodiment. Data of logic "1" or "0" is written in accordance with the presence or absence of a contact hole 3. In the ROM, the diffusion layer 4 formed on the substrate surface is used as the common current line. The diffusion layer 13 as a source connected to the bit line is formed in the bottom of the trench. A special element isolation region need not be formed between two adjacent memory cells, thereby achieving a high packing density.

Figure 3:
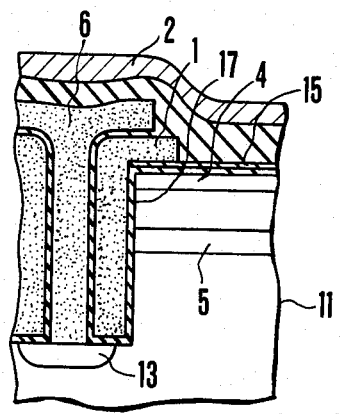
FIG. 3 is a cross-sectional view of a ROM according to still another embodiment of the present invention.

FIG. 3 shows still another embodiment of the present invention. Unlike the ROMs of FIGS. 1 and 2 which perform data write operation in accordance with the presence/absence of a contact hole, according to the embodiment shown in FIG. 3, data writing is performed in accordance with the concentration of an impurity contained in a p-type channel doped layer 5 for controlling the threshold voltage. When the concentration of the impurity contained in the channel doped layer 5 falls within the range between $10^{16}$ cm$^{-3}$ and $10^{18}$ cm$^{-3}$, a low threshold voltage and a high threshold voltage higher than the power supply voltage are set. When a word line 1 is selected, vertical MOSFETs in some memory cells are turned on and in the remaining memory cells are not turned on, thereby setting the write mode. The memory cell size of this embodiment is about 2 μm² in the same manner as in the embodiments of FIGS. 1A to 1C and 2A to 2C. The layout bit patterns of the finished mask ROM are identical. The stored data can be strictly confidential.

In the above embodiments, n-channel vertical MOSFETs are exemplified. However, a p-channel vertical MOSFET may be utilized. In this case, the regions of the p-channel vertical MOSFET have a conductivity type opposite to those of the n-channel vertical MOSFET.

Methods of manufacturing the read-only memories of FIGS. 1A to 1C and 2A to 2C will be described hereinafter. In the following description, data writing is performed in accordance with the presence/absence of a contact hole for the bit line.

FIGS. 4A to 4L are respectively cross-sectional views for explaining the steps in manufacturing the ROM shown in FIGS. 1A to 1C.

Figure 4A:
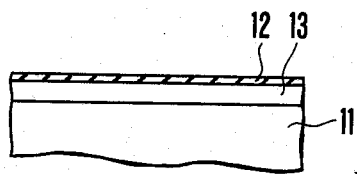
FIGS. 4A to 4L are respectively cross-sectional views for explaining the steps in manufacturing the ROM shown in FIGS. 1A to 1C.

As shown in FIG. 4A, a 1,500 Å thick silicon oxide film 12 is formed by thermal oxidation on a major surface of a silicon substrate 11 as a p-type semiconductor substrate. Arsenic ions are implanted in the substrate 11 to a depth of 0.2 μm to form a shallow n-type diffusion layer 13 connected to the bit line through a contact hole.

Figure 4B:
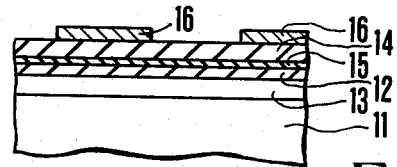

As shown in FIG. 4B, a 1 μm thick silicon oxide film 14 and a 2,500 Å thick silicon nitride film 15 are formed by chemical vapor deposition (to be referred to as CVD hereinafter) to constitute a multilayer film. A resist film is formed and patterned to obtain a matrix-like trench resist pattern 16 having a 0.5 μm width for a trench parallel to a bit line direction and a 1.0 μm width for a trench parallel to a word line.

Figure 4C:
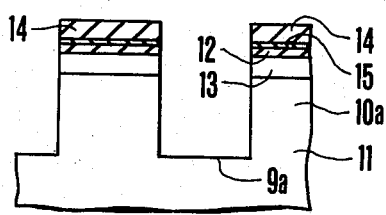

As shown in FIG. 4C, the silicon oxide film 14, the silicon nitride film 15 and the silicon oxide film 12 which constitute a multilayer structure are sequentially etched using the trench resist pattern as a mask. After the trench resist pattern is removed, the silicon substrate 11 is etched by reactive ion etching using the multilayer pattern as a mask. As a result, a matrix-like trench 9a of 1 to 2 μm depth and a convex-like channel region 10a are formed.

Figure 4D:
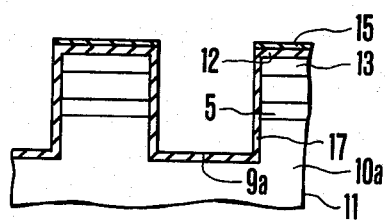

As shown in FIG. 4D, after the silicon oxide film 14 is removed by a hydrofluoric acid solution, a silicon surface layer in the trench 9a is etched by 1,000 Å by a fluoronitric acid solution mixture, thereby removing a contaminated layer in the inner surface of the trench 9a. Subsequently, thermal oxidation is performed to form a 300 Å thick silicon oxide film 17 as a gate insulating film. Boron ions are implanted from the surface of the resultant structure to form a channel doped layer 5 at a predetermined depth. The channel doped layer 5 need not be formed.

Figure 4E:
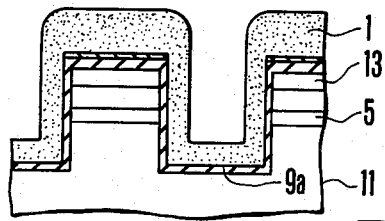

As shown in FIG. 4E, by utilizing a difference between polysilicon growth on the surface of the silicon substrate 11 and polysilicon growth on the side and bottom surfaces of the trench 9a in accordance with low pressure (LP) CVD using phosphine-doped monosilane gas, a polysilicon film 1 is formed on the entire surface. In this case, a thickness of the polysilicon film 1 on the surface of the silicon substrate 11 is 7,000 Å, and a thickness of the polysilicon film 1 on the inner wall surface of the trench 9a is about 3,000 Å. The polysilicon film 1 is not completely filled at the side of the trench 9a. having a larger width. However, the polysilicon film 1 is completely filled at the side of the trench 9a having a smaller width, as shown in FIG. 4L.

Figure 4F:
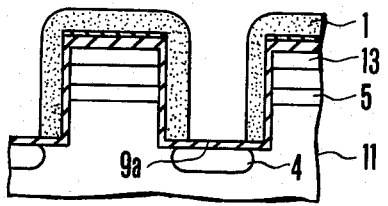

As shown in FIG. 4F, subsequently, by utilizing etching anisotropy of reactive ion etching, only the portion of the polysilicon film on the trench bottom at the wide side is removed. Arsenic ions are implanted to form a 0.2 μm deep n-type diffusion layer 4 serving as the common current line.

Figure 4G:
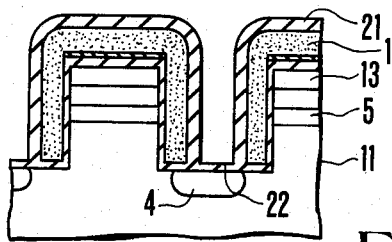

As shown in FIG. 4G, the gate oxide film 17 is etched by a hydrofluoric acid solution from the bottom of the trench, and a 1,500 Å thick silicon oxide film 21 as an insulating film is formed by wet oxidation on the surface of the polysilicon film 1 at a temperature of 600° to 650° C. In this case, a silicon oxide film 22 serving as a 100 Å thick insulating film is formed on a portion of the silicon substrate 11 which defines the bottom of the trench 9a.

Figure 4H:
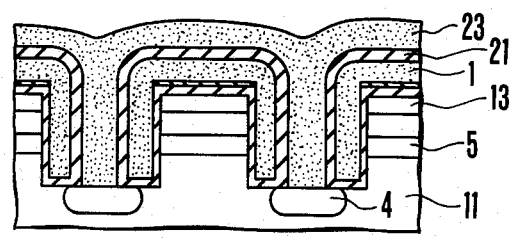

As shown in FIG. 4H, the silicon oxide film 22 is etched by a hydrofluoric acid solution from the bottom of the trench 9a. Subsequently, a phosphorus-doped polysilicon film 23 having a high phosphorus concentration and a thickness of about 2,500 to 3,000 Å is filled in the trench 9a. A filling material may be another material such as an insulator.

Figure 4I:
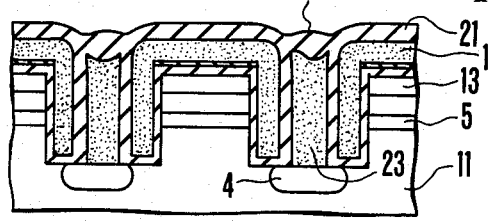

As shown in FIG. 4I, the polysilicon film 23 on the surface of the silicon substrate 11 is etched back by reactive ion etching to expose the silicon oxide film 21. Thermal oxidation is performed to form a silicon oxide film 24 as an insulating film on the polysilicon film 23.

Figure 4J:
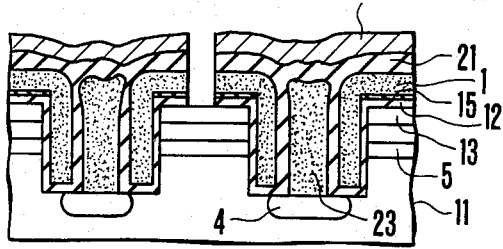

As shown in FIG. 4J, a resist film is formed and patterned to form a bit line contact hole resist pattern 25 corresponding to write data. The silicon oxide film 21, the polysilicon film 1, the silicon nitride film 15 and the silicon oxide film 12 are sequentially removed by reactive ion etching using the resist pattern 25 as a mask. The contact hole is formed in a predetermined region surrounded by the matrix-like trench 9a.

Figure 4K:
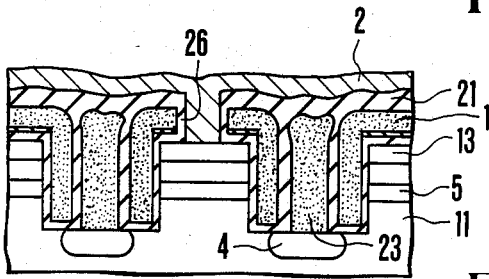
Figure 4L:
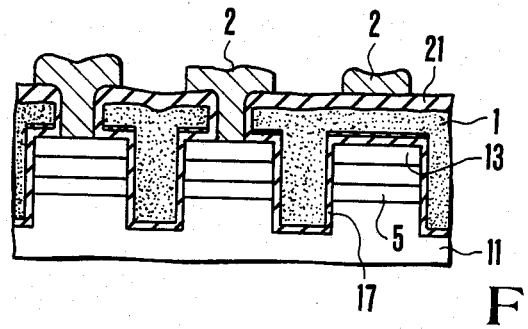

As shown in FIG. 4K, after the resist pattern 25 is removed, an oxide film 26 is formed by thermal oxidation on the inner wall surface of the bit line contact hole. Thereafter, the oxide film is removed by reactive ion etching from only the inner surface of the contact hole. An aluminum film is deposited and patterned to obtain bit lines 2. It should be noted that the bit line may be connected to the diffusion layer through a contact hole or by a Schottky junction.

The cross-sectional views in FIGS. 4A to 4K are taken along the plane parallel to the bit line so as to show a wide side of the trench. However, the cross-sectional view in FIG. 4L is taken along the plane parallel to the word line so as to show a narrow side of the trench. In the above description, the longitudinal width of the trench is different from its transverse width, but can be the same thereas. When the longitudinal width is different from the transverse width, the trench is filled in a self-aligned manner, and a higher packing density can be achieved.

A method of manufacturing the ROM shown in FIGS. 2A to 2C will be described in detail hereinafter. Unlike the ROM of FIGS. 1A to 1C wherein the convex-shaped region surrounded by the trench is used as an element formation region, the recessed trench region and its surrounding area are used as an element formation region in FIGS. 5A to 5M.

Figure 5A:
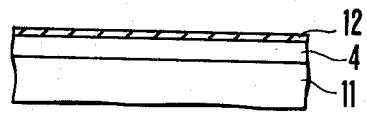
FIGS. 5A to 5M are respectively cross-sectional views for explaining the steps in manufacturing the ROM shown in FIGS. 2A to 2C.

As shown in FIG. 5A, a 1,500 Å thick silicon oxide film 12 is formed by thermal oxidation on a major surface of a p-type silicon substrate 11. Arsenic ions are implanted to a depth of 0.2 μm to form a shallow n-type diffusion layer 4 serving as a common current line in the silicon substrate 11.

Figure 5B:
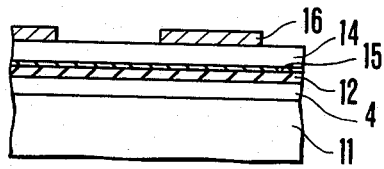

As shown in FIG. 5B, a 1 μm thick silicon oxide film 14 and a 2,500 Å thick silicon nitride film 15 are formed by CVD to constitute a multilayer film. A resist film is formed to cover the entire surface. Unlike in the method of FIG. 4, island trenches (discretely located) are formed, and channel regions are formed in a matrix form. In this case, a resist pattern 16 has a trench pattern with different widths such that the channel region is formed around the trench for each cell and that a width of the channel region (FIG. 5) along a direction parallel to a bit line is as narrow as about 0.5 μm, and a width thereof along a direction parallel to a word line is as wide as 1.0 μm.

Figure 5C:
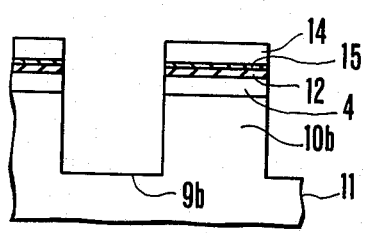

As shown in FIG. 5C, the silicon oxide film 14, the silicon nitride film 15 and the silicon oxide film 12 which constitute a multilayer structure are sequentially etched by using the trench resist pattern 16. After the resist pattern is removed, the silicon substrate 11 is etched by reactive ion etching using the multilayer pattern as a mask, thereby forming discrete island trenches 9b each having a depth of 1 to 2 μm.

Figure 5D:
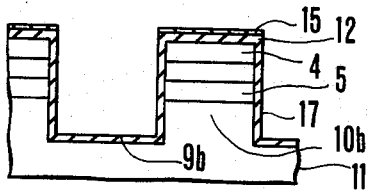

As shown in FIG. 5D, after the silicon oxide film 14 is removed by a hydrofluoric acid solution, a silicon portion in the island trench 9b is removed to a depth of 1,000 Å, thereby removing a contaminated layer on the surface of the trench 9b. A 300 Å thick silicon oxide film 17 serving as a gate insulating film is formed by thermal oxidation, and boron ions are implanted to a predetermined depth to form a channel doped layer 5. The channel doped layer 5 need not be formed.

Figure 5E:
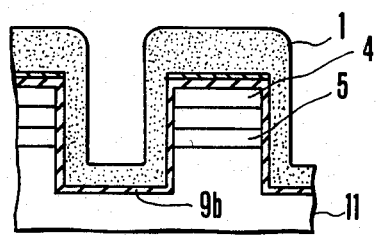

As shown in FIG. 5E, by utilizing a difference between polysilicon growth on the surface of the silicon substrate 11 and polysilicon growth on the side and bottom surfaces of the trench 9b in accordance with low pressure (LP) CVD using phosphine-doped monosilane gas, a polysilicon film 1 is formed on the entire surface. In this case, a thickness of the polysilicon film 1 on the surface of the silicon substrate 11 is 7,000 Å, and a thickness of the polysilicon film 1 on the inner wall surface of the trench 9b is about 3,000 Å.

Figure 5F:
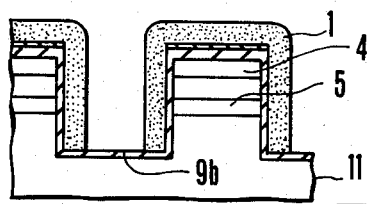

As shown in FIG. 5F, by using etching anisotropy of reactive ion etching, the polysilicon film is removed from only the bottom of the trench 9b.

Figure 5G:
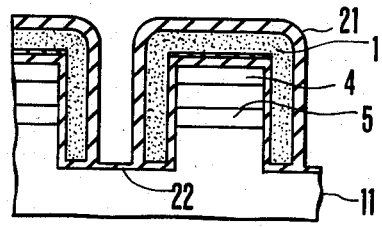

As shown in FIG. 5G, after the silicon oxide film 17 is removed by a hydrofluoric acid solution from the bottom of the trench 9b, wet oxidation at a temperature of 600° to 650° C. is performed to form a 1,500 Å thick silicon oxide film 21 serving as an insulating film on the surface of the polysilicon film 1. In this case, a 100 Å thick silicon oxide film 22 as an insulating film is formed on the surface of the silicon portion which defines the bottom of the trench 9b.

Figure 5H:
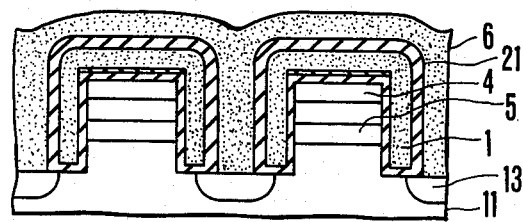
Figure 5I:
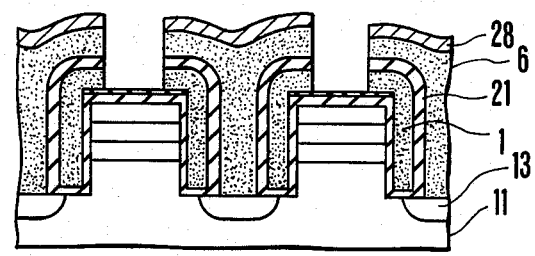

As shown in FIG. 5H, the silicon oxide film 22 is etched by the hydrofluoric acid solution from the bottom of the trench 9b. Subsequently, a phosphorus-doped polysilicon film 6 having a high phosphorus concentration and a thickness of about 2,500 to 3,000 Å is filled by CVD in the trench 9b. Phosphorus is diffused by annealing to form an n-type diffusion layer 13 under the trench 9b.

As shown in FIG. 4I, a word line resist pattern 28 (e.g., a continuous pattern in a direction perpendicular to the surface of FIG. 4I) is formed by lithography. The polysilicon film 6, the silicon oxide film 21 and the polysilicon film 1 are sequentially etched by reactive ion etching using the resist pattern 28 as a mask.

Figure 5J:
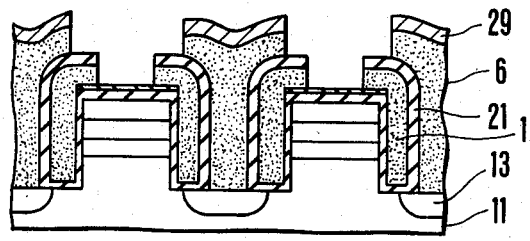

As shown in FIG. 5J, a resist pattern 29 for a predetermined polysilicon film pattern is formed by lithography after the word line resist pattern 28 is removed. The polysilicon film 6 is etched by using the resist pattern 29. As a result, the polysilicon film 6 is independently formed in units of trenches 9b.

Figure 5K:
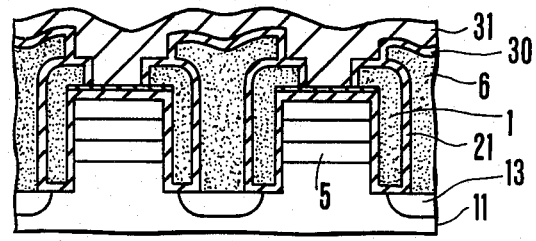

As shown in FIG. 5K, a 1,000 Å thick silicon oxide film 30 serving as an insulating film is formed on the exposed side surface of the polysilicon film 1 and the surface of the polysilicon film 6. A phosphosilicate glass film 31 is deposited by CVD and is reflowed.

Figure 5L:
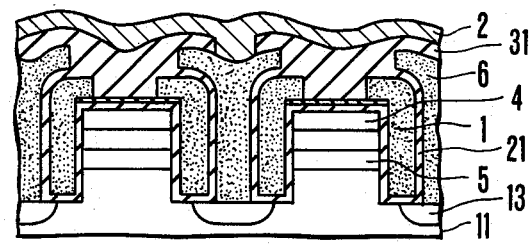

As shown in FIG. 5L, a resist film is formed by lithography and etched to form a bit line contact hole pattern corresponding to the write data. The phosphosilicate glass 31 is patterned by reactive ion etching using this resist pattern. The contact hole exposing a predetermined portion of the polysilicon film is formed. After the resist pattern is removed, an aluminum film is deposited and patterned to form bit lines 2.

Figure 5M:
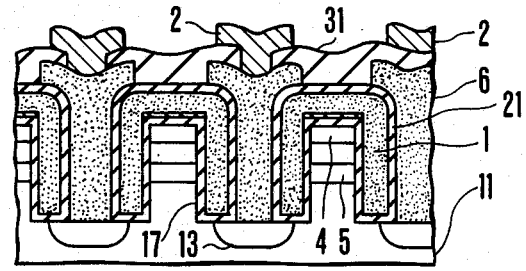

The cross-sectional views in FIGS. 5A to 5L are taken along the plane parallel to the bit line so as to show a wide side of the convex-shaped channel region formed by the trench which is discretely formed from other trenches. However, the cross-sectional view in FIG. 5M is taken along the plane parallel to the word line so as to show a narrow side of the convex-shaped channel region formed by the trench. The longitudinal width of the trench in FIGS. 5A to 5L is different from its transverse width, but can be the same thereas.

The data write process in the methods of FIGS. 4A to 4L and 5A to 5M is performed by using the bit line contact hole. However, a mask corresponding to the input data may be prepared when the channel doped layer is formed in the step of FIG. 4D or 5D, and channel doping may be performed through the mask, thereby easily varying the threshold voltages of the respective memory cells. The same manufacturing process can be utilized for write operation by channel doping. The threshold voltage write type structure may be used together with the contact hole write type structure. In the step of FIG. 5H, the diffusion layer 13 comprises a diffusion layer formed by annealing. However, the diffusion layer 13 may be formed by ion implantation, as shown in FIG. 4F.

Referring to FIGS. 4A to 4K and FIGS. 5A to 5L, the diffusion layers (FIGS. 4B and 5G) are formed on the substrate surfaces at the early steps, respectively. However, these diffusion layers may be formed by ion implantation in steps of FIGS. 4J and 5I, respectively.

According to the present invention, a word line serving as a gate electrode is formed on the inner wall surface of the trench which is substantially perpendicular to the major surface of the semiconductor substrate, and diffusion layers serving as source/drain regions are formed at the upper and lower channel regions, thereby constituting a vertical MOSFET serving as an intracell transistor. A predetermined bit line pattern is formed on the surface of the substrate. One of the diffusion layers is electrically connected to the bit line through the corresponding contact hole. The other diffusion layer serves as the common current line. Therefore, the element isolation region need not be formed, the memory cell size can be decreased, and a high packing density thereof can be achieved.

What is claimed is:

1. A read-only memory comprising memory cells each having a vertical metal oxide semiconductor field effect transistor and a bit line, said vertical metal oxide semiconductor field effect transistor having a gate electrode serving as a word line, a source and a drain, said source and said drain being constituted by first and second diffusion layers, and a vertical channel region between said source and said drain, said gate electrode being formed on a side wall of a trench, said trench havig side wall surfaces substantially perpendicular to a major surface of a semiconductor substrate of a first conductivity type and a interconnecting bottom surface substantially perpendicular to said side wall surfaces, said first and second diffusion layers being of a second conductivity type formed in an upper portion of said semiconductor substrate and in a bottom of said trench, respectively, said bit lines being formed in a predetermined pattern, one of said first and second diffusion layers being connected to said bit line through a contact hole and the other of said first and second diffusion layers being used as a common current line.

2. A memory according to claim 1, wherein said contact hole is formed in accordance with date to be written into a given cell.

3. A memory according to claim 1, wherein said vertical channel region comprises a channel doped region.

4. A memory according to claim 1, wherein said trench comprises a grid-like trench, a memory cell is in a region surrounded by said grid-like trench, and said second diffusion layer being used as said common current line.

5. A memory according to claim 4, wherein said trench has a pattern narrowed in a direction parallel to the bit line and widened in a direction parallel to the word line, a narrowed pattern portion of said trench is filled by said gate electrode, and a widened pattern portion of said trench is filled by said gate electrode and other material.

6. A memory according to claim 1, wherein said trench comprises an island-like trench, and a memory cell region is located in said island-like trench.

7. A memory according to claim 6, wherein a distance between adjacent trenches has a pattern narrowed along a direction parallel to the bit line and widened along a direction parallel to the word line, and said first diffusion layer being used as said common current line.

8. A memory according to claim 1, wherein said vertical channel region comprises a channel doped region whoe impurity concentration corresponds to data to be written into a given cell.

9. A memory according to claim 8, wherein said channel doped region has an impurity concentration corresponding to the data to be written into a given cell.

* * * * *